United States Patent [19]

Moriyama

[11] Patent Number: 5,675,337
[45] Date of Patent: Oct. 7, 1997

[54] ANALOG-TO-DIGITAL CONVERTING DEVICE

[75] Inventor: Hiroyuki Moriyama, Hyogo, Japan

[73] Assignees: Mitsubishi Electric Semiconductor Software Co., Ltd., Hyogo; Mitsubishi Denki Kabushiki Kaisha, Tokyo, both of Japan

[21] Appl. No.: 556,392

[22] Filed: Nov. 9, 1995

[30] Foreign Application Priority Data

Jun. 22, 1995 [JP] Japan .................................. 7-155950

[51] Int. Cl.$^6$ .................................................. H03M 1/12
[52] U.S. Cl. ........................................ 341/141; 341/155
[58] Field of Search .................................. 341/118, 119, 341/120, 121, 155, 141

[56] References Cited

U.S. PATENT DOCUMENTS 5,172,116 12/1992 Noma .

5,432,514 7/1995 Mukuda et al. ..................... 341/120

OTHER PUBLICATIONS

Ahlers, Ernst and Peter Röbke-Doerr. "8 X 12 Bit: A/D-Wandler mit 8 Kanälen und 12 Bit Auflösung am Druckerport." *Elrad* 1993, Heft 10 (pp. 28–31).

*Primary Examiner*—Brian K. Young
*Attorney, Agent, or Firm*—Leydig, Voit & Mayer Ltd.

[57] ABSTRACT

A analog-to-digital converting device includes an analog-to-digital converting operation control unit for temporarily stopping an analog-to-digital converter in response to a trigger signal applied thereto and for restarting the analog-to-digital converter by imposing the operation conditions, which have been initially set up, on the analog-to-digital converter again. The device can forcefully terminate a scanning operation and restart analog-to-digital converting operations in a scan mode under the initially set up operating conditions without having to use an interrupt program executed by a CPU.

16 Claims, 8 Drawing Sheets

ANALOG-TO-DIGITAL CONVERTING DEVICE

BACKGROUND OF THE INVENTION

1. Field of the Invention

The present invention relates to an analog-to-digital converting device embedded in a microcomputer for selecting one arbitrary input channel from among a plurality of input channels to convert an analog signal into a digital signal.

2. Description of the Prior Art

Figure 1:
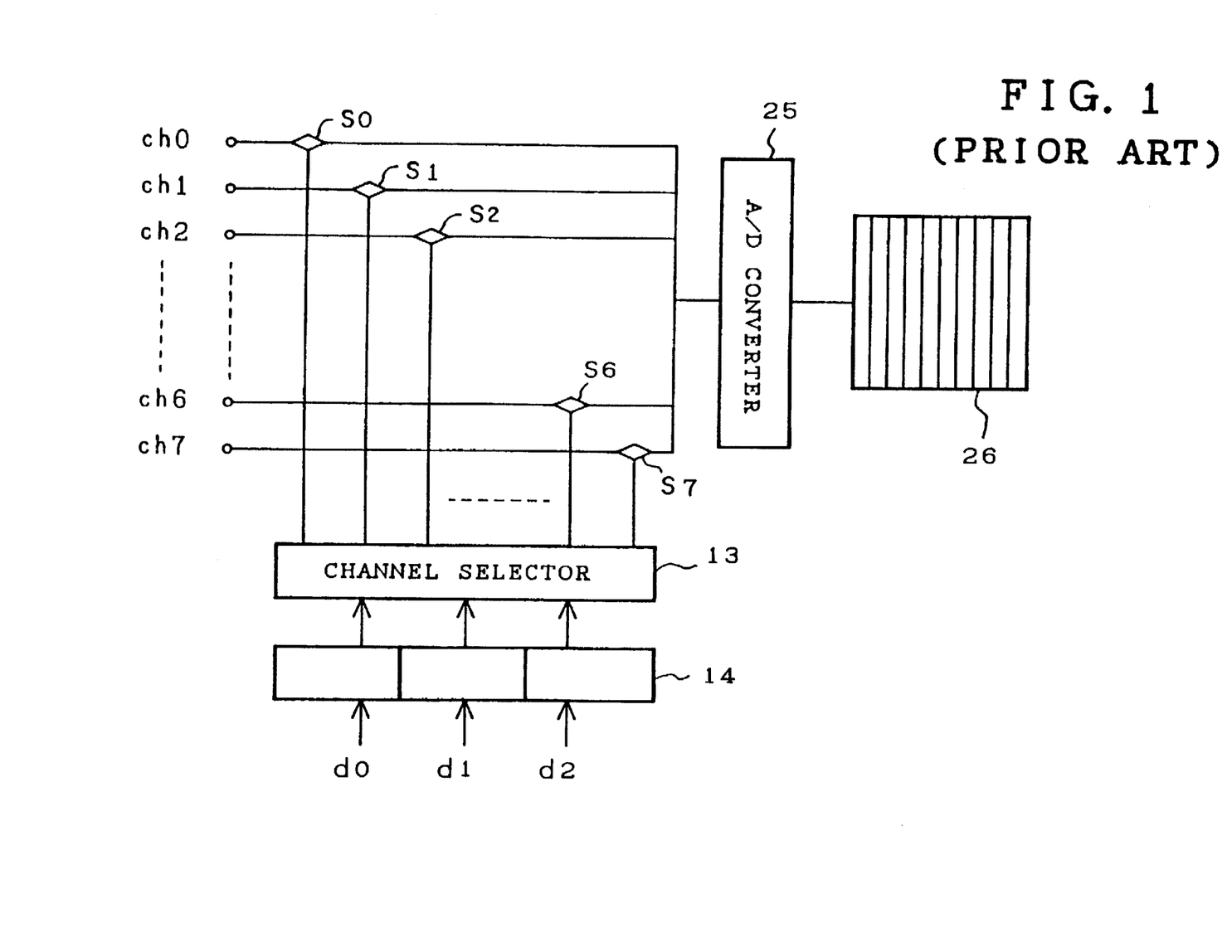
FIG. 1 is a block diagram showing the structure of a prior art analog-to-digital converting device.

Referring now to FIG. 1, it illustrates a block diagram showing the structure of a prior art analog-to-digital converting device. In the figure, reference numeral 13 denotes a channel selector for selecting one arbitrary input channel from among a plurality of input channels ch0–ch7, 25 denotes an analog-to-digital converter (this is abbreviated as A/D converter in the figure) which converts an analog signal applied to the input channel selected by the channel selector 13 into a digital signal, symbols S0–S7 designate switches which transmit analog signals present at the input channels ch0–ch7 to the analog-to-digital converter 25, respectively, and reference numeral 14 denotes a channel setting register into which a channel setting binary data showing one input channel are written by an interrupt program included in a microcomputer or the like disposed outside the device. The channel selector 13 selects one input channel from among the plural input channels in accordance with the contents of the channel setting register 14. Furthermore, reference numeral 26 denotes digital value storing registers for storing converted results obtained by the analog-to-digital converter 25, the number of which are equal to the number of plural input channels ch0–ch7. The channel selector 13 determines which switch among the switches S0–S7 must be turned on in accordance with the channel setting binary data stored in the channel setting register 14. Then, the analog-to-digital converter 25 receives an analog signal present at an input channel connected to the switch which has been turned on. Converted results stored in the digital value storing registers 26 can be read out by a central processing unit (CPU) of the microcomputer, not shown in the figure, or the like.

The analog-to-digital converting device provided with the plural input channels ch0–ch7 needs to select an input channel to convert an analog signal present at the selected channel into a digital signal. This input channel setting is performed by writing binary data, which represents an input channel, into the channel setting register 14. For example, the channel setting register 14 is composed of 3 bits. A 3-bit binary data which shows one input channel is written into the channel setting register 14. That is, for example, when the three bits d0, d1, and d2 of the binary data are 000, the input channel ch0 is selected, and when the three bits d0, d1, and d2 of the binary data is 001, the input channel ch1 is selected. When such binary data showing one input channel is written into the channel setting register 14, the channel selector 13 switches on a corresponding switch by referring to the binary data so that the input channel represented by the data stored in the channel setting register 14 is selected and electrically connected to the analog-to-digital converter 25. Then, the analog-to-digital converter 25 converts an analog signal present at the selected input channel into a digital signal. After the analog-to-digital conversion is completed, the converted result is stored in one of the digital value storing registers 26 which corresponds to the selected input channel.

When the analog-to-digital converting device needs to convert an analog signal present at another input channel into a digital signal, it writes a binary data which represents the other input channel into the channel setting register 14 so as to connect the other input channel with the converter. The CPU in the microcomputer or the like receives a request for writing a binary data into the channel setting register 14 from an interrupt program and then performs the writing operation.

There may be some cases where it is necessary to change an input channel setting for analog-to-digital conversion after the expiration of a predetermined time interval or at a predetermined time, and it is necessary to change an input channel setting for analog-to-digital conversion in response to a signal delivered from outside the device. In these cases, an interrupt request signal to perform an analog-to-digital converting operation on a desired input channel may be delivered to the CPU. Then, it handles the interrupt in response to the request signal and writes programmed data into the channel setting register 14. Then, the CPU selects the desired input channel from among the plural input channels.

Figure 2:
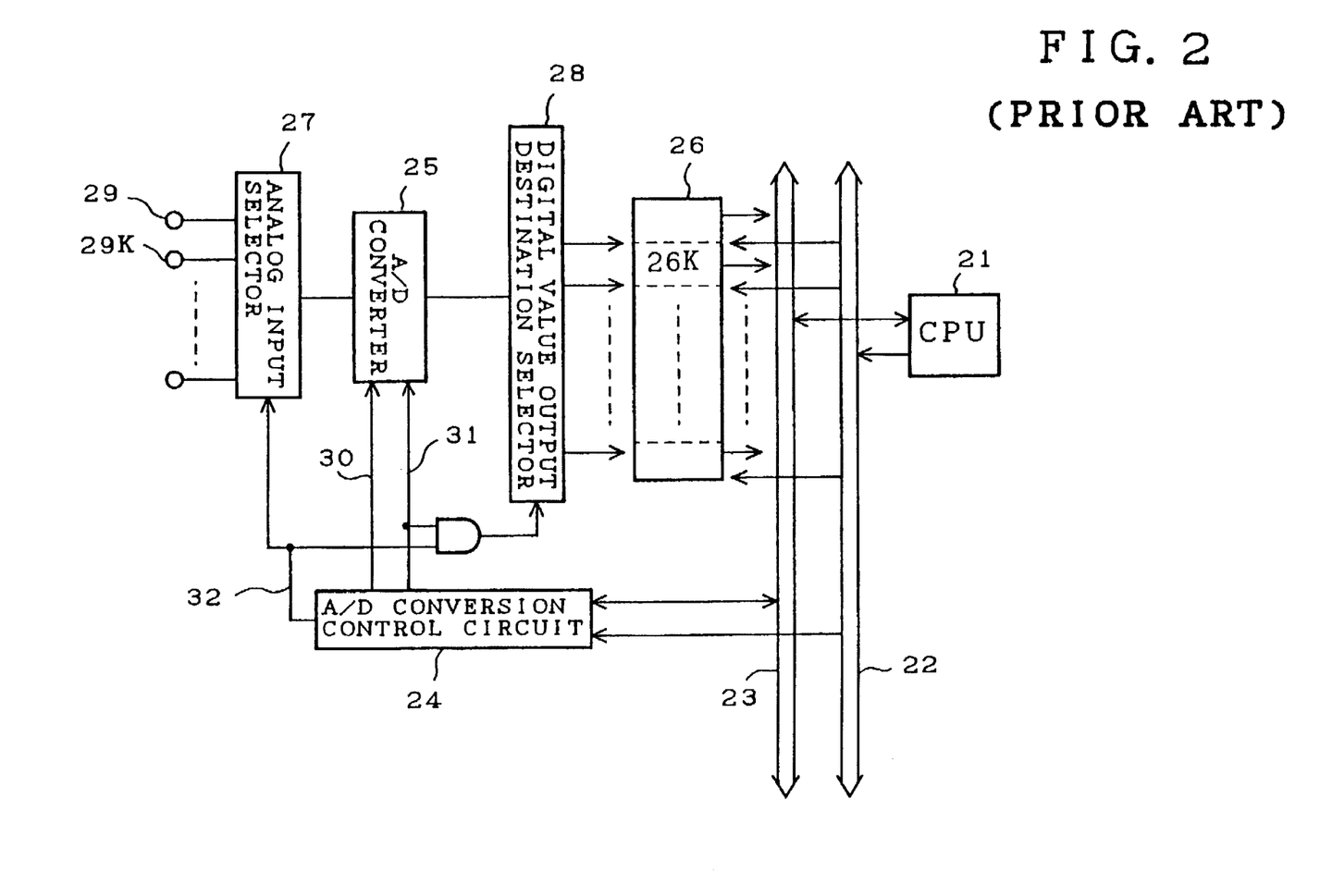
FIG. 2 is a block diagram showing the structure of another prior art analog-to-digital converting device.

Referring now to FIG. 2, it illustrates a block diagram showing the structure of another prior art analog-to-digital converting device. In the figure, like elements are designated by the same reference numerals as in FIG. 1 duplicate description of and the elements will be omitted hereinafter. Furthermore, in the figure reference numeral 21 denotes a CPU which preforms various operations and controls reading and writing operations on various kinds of memories such as a ROM, a RAM and the like and various kinds of registers not shown in the figure, reference numeral 22 denotes an address bus for transmitting address data between the CPU 21 and each component of the device, reference numeral 23 denotes a data bus for transmitting data between the CPU 21 and each component of the device, and reference numeral 24 denotes an analog-to-digital conversion control circuit (this is abbreviated as A/D conversion control circuit in the figure), in which all operating conditions required for analog-to-digital conversion such as analog-to-digital converting mode, converting rate, an input channel to be selected and so on are set up, for controlling an analog input selector, which will be described hereinafter, and the analog-to-digital converter 25. The analog-to-digital conversion control circuit 24 is provided with a mode selector and an analog-to-digital conversion start register not shown in FIG. 2. The mode register defines the information about the analog-to-digital converting mode and converting rate, and a selecting signal 32 which selects an analog input (input channel) as operation conditions. The analog-to-digital conversion start register stores data for triggering analog-to-digital converting operations.

Furthermore, reference numeral 27 denotes an analog input selector, which has functions similar to those of the channel selector 13 of FIG. 1, for selecting one arbitrary input channel from among a plurality of input channels. This analog input selector 27 selects an input terminal from among a plurality of input terminals (input channels) 29 in accordance with the select signal 32 defined by the mode register in the analog-to-digital conversion control circuit 24 and then transmits an analog signal applied to the selected terminal to the analog-to-digital converter 25. Reference numeral 28 denotes a digital value output destination selector which selects a corresponding one of the plural digital value storing registers 26 according to the select signal 32 to store an n-bit digital value output by the analog-to-digital converter 25 in the selected register, reference numeral 30 denotes a start signal, which is delivered from the analog-to-digital conversion control circuit 24 to the analog-todigital converter 25, for triggering an analog-to-digital converting operation, and reference numeral 31 denotes a stop signal, which is delivered from the analog-to-digital conversion control circuit 24 to the analog-to-digital converter 25, for stopping an analog-to-digital converting operation.

In operation, the CPU 21 writes data showing operating conditions required for analog-to-digital conversion into the mode register and analog-to-digital converting register in the analog-to-digital conversion control circuit 24 by means of the address bus 22 and data bus 23. The select signal 32 output by the analog-to-digital conversion control device 24 is input to the analog input selector 27 and then one of the plural input terminals 29 is selected. Hereinafter, the selected input terminal is designated by reference numeral 29k. When the start signal 30 for triggering analog-to-digital converting operations is input to the analog-to-digital converter 25, the converter starts an analog-to-digital conversion operation on an analog signal applied to the input terminal 29k. Thus, the analog-to-digital converting device receives the analog signal passing through the input channel selected by the analog input selector 27 and then converts the analog signal into an n-bit digital signal (a digital value) with respect to a reference voltage applied thereto from outside the device. When the analog-to-digital converting operation is completed, the stop signal 31 is output by the analog-to-digital converter 25 and then a signal produced by the logical AND operation on the stop signal 31 and select signal 32 is input into the digital value output destination selector 28. Finally, the digital value is stored in the selected digital value storing register 26k.

In a mode of repeating analog-to-digital converting operations for one of the plural input terminals 29, i.e., one input channel (this input channel is designated by i), the select signal 32 constantly shows the input channel i and the analog-to-digital conversion control circuit 24 outputs the start signal 30 for the next analog-to-digital converting operation in response to the stop signal 31 after the current analog-to-digital converting operation is completed. Therefore, the device repeatedly performs analog-to-digital converting operations for the input channel i unless the CPU 21 forcefully terminates the current analog-to-digital converting operation by means of the address bus 22 and data bus 23.

Therefore, a problem with the prior art analog-to-digital converting devices is that a stopping operation in a scan mode for a plurality of input channels and a restarting operation after that increase the load on the CPU because an interrupt program or the like needs to make a request for the performance of all the operations to the CPU.

Another problem with the prior art analog-to-digital converting devices is that the CPU must bear a heavy load of changing an input channel after restarting a scanning operation in a scan mode.

SUMMARY OF THE INVENTION

It is an object of the present invention to provide an analog-to-digital converting device which can forcefully terminate a scanning operation, restart analog-to-digital converting operations in a scan mode under the initially set up operating conditions, and further change an input channel to be handled first after restarting the next scanning operation during the present scanning operation, without having to use an interrupt program conducted by a CPU in a microcomputer or the like, thereby decreasing the load on the CPU.

In accordance with the present invention, there is provided an analog-to-digital converting device comprising an operating conditions storing unit for storing operating conditions which define analog-to-digital converting operations of an analog-to-digital converter, and a control unit for temporarily stopping the analog-to-digital converter in response to a predetermined signal applied thereto and then restarting the analog-to-digital converter by imposing the operating conditions stored in the operating conditions storing unit on the analog-to-digital converter again.

In operation, the control unit temporarily stops an analog-to-digital converting operation and after that resets up the operating conditions stored in the operation conditions storing unit so as to restart the analog-to-digital converter. This results in decreasing the volume of a software program which controls analog-to-digital converting operations of the device.

In a preferred embodiment of the present invention, the control unit further comprises a stopping unit for forcefully stopping the analog-to-digital converter in response to the predetermined signal even if the analog-to-digital converter is in action.

According to a preferred embodiment of the present invention, the analog-to-digital converting device further comprises an analog-to-digital converting operation detecting unit for detecting whether or not the analog-to-digital converter is in action. Furthermore, when the analog-to-digital converting operation detecting unit determines that the analog-to-digital converter is in action after the control unit receives the predetermined signal, the control unit stops the analog-to-digital converter after an on-the-fly analog-to-digital converting operation is completed. Therefore, the uncertainty of the digital value obtained by the analog-to-digital converting operation can be avoided.

In a preferred embodiment of the present invention, the analog-to-digital converting device further comprises an analog-to-digital converting operation detecting unit for detecting whether or not the analog-to-digital converter is converting an analog signal present at a predetermined input channel into a digital signal. Furthermore, when the analog-to-digital converting operation detecting unit detects an analog-to-digital converting operation on the predetermined input channel after the control unit has received the predetermined signal, the control unit cancels the stopping operation on the analog-to-digital converter to proceed with analog-to-digital converting operations. Therefore, the analog-to-digital converting device makes it possible to avoid needless operations of restarting a scanning from the input channel ch0 after forcefully stopping an analog-to-digital converting operation for the input channel ch0.

According to a preferred embodiment of the present invention, the analog-to-digital converting device further comprises a plurality of registers each storing a digital value obtained by the analog-to-digital converter, and a plurality of semaphores having a one-to-one correspondence with the plural registers. The contents of all the semaphores are cleared in response to the predetermined signal. Furthermore, the contents of each semaphore are cleared when a digital value is written into a corresponding register. Each semaphore is set to a specific value when the contents of a corresponding register is read out. Therefore, it becomes possible to determine whether or not a digital value stored in each of the digital value storing registers is the latest one by checking the binary data of each of the semaphores.

In a preferred embodiment of the present invention, the analog-to-digital converting device further comprises a priority unit for determining an input channel from which an analog-to-digital converting operation is to be performed first when the analog-to-digital converter is restarted after the control unit has received the predetermined signal, and a unit for restarting the analog-to-digital converter after the control unit has received the predetermined signal so that the analog-to-digital converter converts an analog signal present at the input channel determined by the priority unit into a digital signal first. This results in decreasing the volume of a software program which controls analog-to-digital converting Operations of the device.

Further objects and advantages of the present invention will be apparent from the following description of the preferred embodiments of the invention as illustrated in the accompanying drawings.

DETAILED DESCRIPTION OF THE PREFERRED EMBODIMENTS

Figure 3:
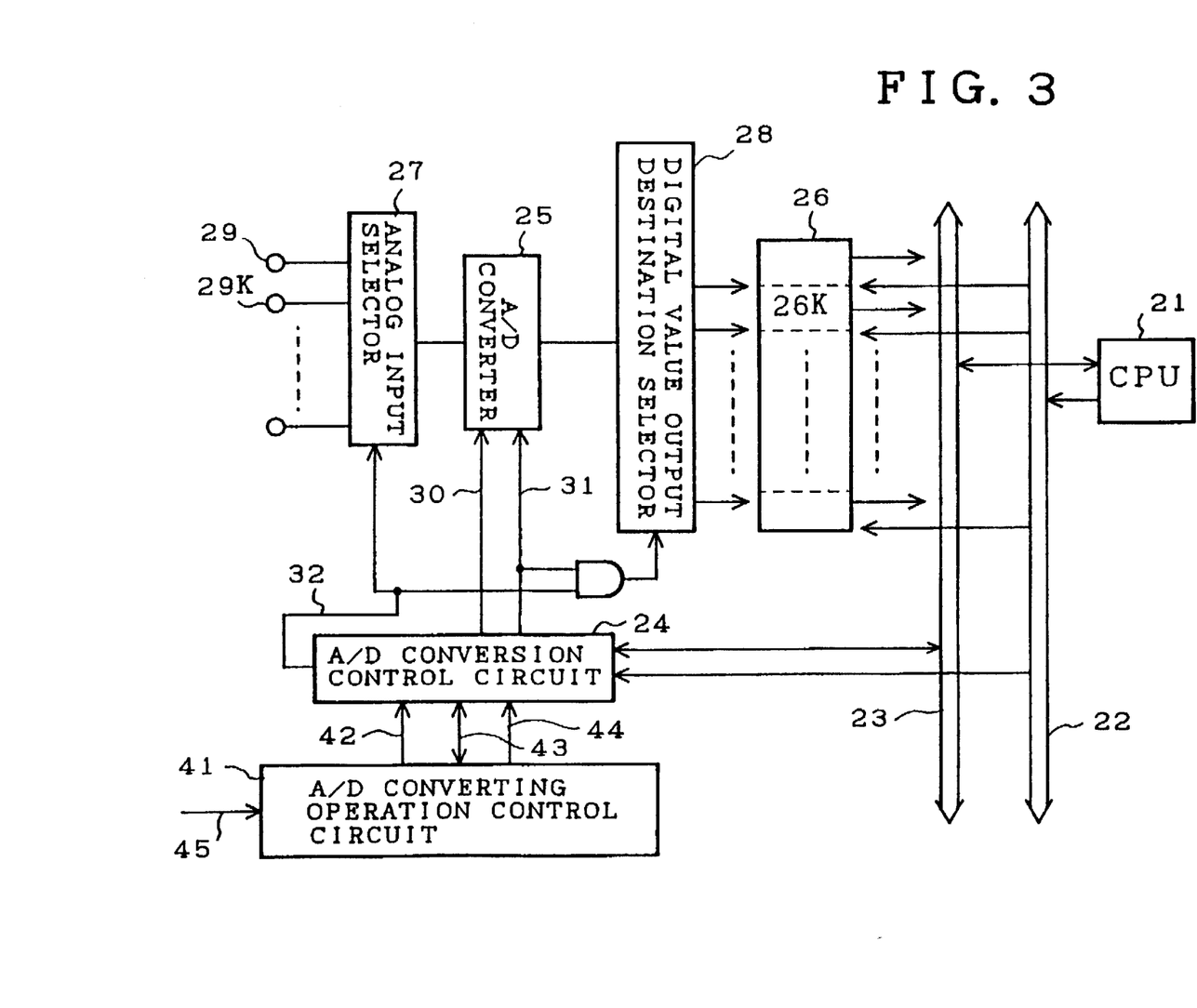
FIG. 3 is a block diagram showing the structure of an analog-to-digital converting device according to an embodiment of the present invention.

Referring now to FIG. 3, it illustrates a block diagram showing the structure of an analog-to-digital converting device according to an exemplary embodiment of the present invention. In the figure, like elements are designated by the same reference numerals as in FIG. 2 and duplicate description of the elements will be omitted hereinafter. Furthermore, in the figure, reference numeral 41 denotes an analog-to-digital converting operation control circuit (this is abbreviated as A/D converting operation control circuit in the figure). The analog-to-digital converting operation control circuit 41 comprises a first section for automatically storing operating conditions which define an analog-to-digital converting operation and are simultaneously written into the analog-to-digital conversion control circuit 24, and a second section for forcefully stopping the analog-to-digital conversion control circuit 24 in response to a trigger signal (this is abbreviated as TRG signal) 45 and for resetting the analog-to-digital conversion control circuit 24 by imposing the operation conditions stored in the first section on the circuit 24 again to make it start to perform an analog-to-digital converting operation.

Additionally, in FIG. 3 reference numeral 42 denotes a stop signal, which is Generated by the analog-to-digital converting operation control circuit 41, for giving instructions for forcefully stopping to the analog-to-digital conversion control circuit 24, reference numeral 43 denotes an operating conditions setting signal for transmitting operating conditions to the analog-to-digital converting operation control circuit 41 after the operating conditions have been written into the analog-to-digital conversion control circuit 24 and for writing the operating conditions stored in the analog-to-digital converting operation control circuit 41 into the analog-to-digital conversion control circuit 24 when the device receives the TRG signal 45, and reference numeral 44 denotes a start signal, which is generated by the analog-to-digital converting operation control circuit 41, for starting the next analog-to-digital converting operation.

Next, the description will be directed to an operation of this exemplary embodiment. A software program allows the CPU 21 to impose operating conditions which define the analog-to-digital converting operation, e.g., operation conditions under which analog-to-digital converting operations are performed repeatedly for the four input channels ch0–ch4 in scan mode, on the analog-to-digital conversion control circuit 24. In this case, the operating conditions are also written into the analog-to-digital converting operation control circuit 41 by using the operating conditions setting signal 43 while they are written into the analog-to-digital conversion control circuit 24. Then, the CPU 21 writes a value showing the start of analog-to-digital converting operations into an analog-to-digital converting start register included in the analog-to-digital conversion control circuit 24. The analog-to-digital conversion control circuit 24 generates the start signal 30 and makes the analog-to-digital converter 25 start to perform analog-to-digital converting operations for the input channels ch0–ch4 in a scan mode.

When the TRG signal 45 is applied to the analog-to-digital converting operation control circuit 41 during the scanning operation of the analog-to-digital converter 25, the analog-to-digital converting operation control circuit 41 makes the stop signal 42 active immediately and delivers it to the analog-to-digital conversion control circuit 24. In response to the stop signal 42, the analog-to-digital conversion control circuit 24 delivers the stop signal 31 to the analog-to-digital converter 25 so as to forcefully stop the scanning operation. Furthermore, the analog-to-digital converting operation control circuit 41 writes the operating conditions, which have been stored therein since the previous analog-to-digital converting operations were started, into the analog-to-digital conversion control circuit 24 by using the operating conditions setting signal 43 so as to reset it, because the contents of the operating conditions in the analog-to-digital conversion control circuit 24 have been changed during the previous scanning operation. After the operation conditions are imposed again, the analog-to-digital converting operation control circuit 41 makes the start signal 44 active and delivers it to the analog-to-digital conversion control circuit 24. The analog-to-digital conversion control circuit 24 generates the start signal 30 and allows the analog-to-digital converter 25 restart and performs scanning operation on the input channels ch0–ch4.

Thus, according to this exemplary embodiment, only applying the TRG signal 45 makes it possible to automatically restart an analog-to-digital converting operation under the operating conditions initially set up from the input channel initially selected without recourse to the CPU 21. This results in reducing the volume of the software program and decreasing the load on the CPU 21.

Figure 4:
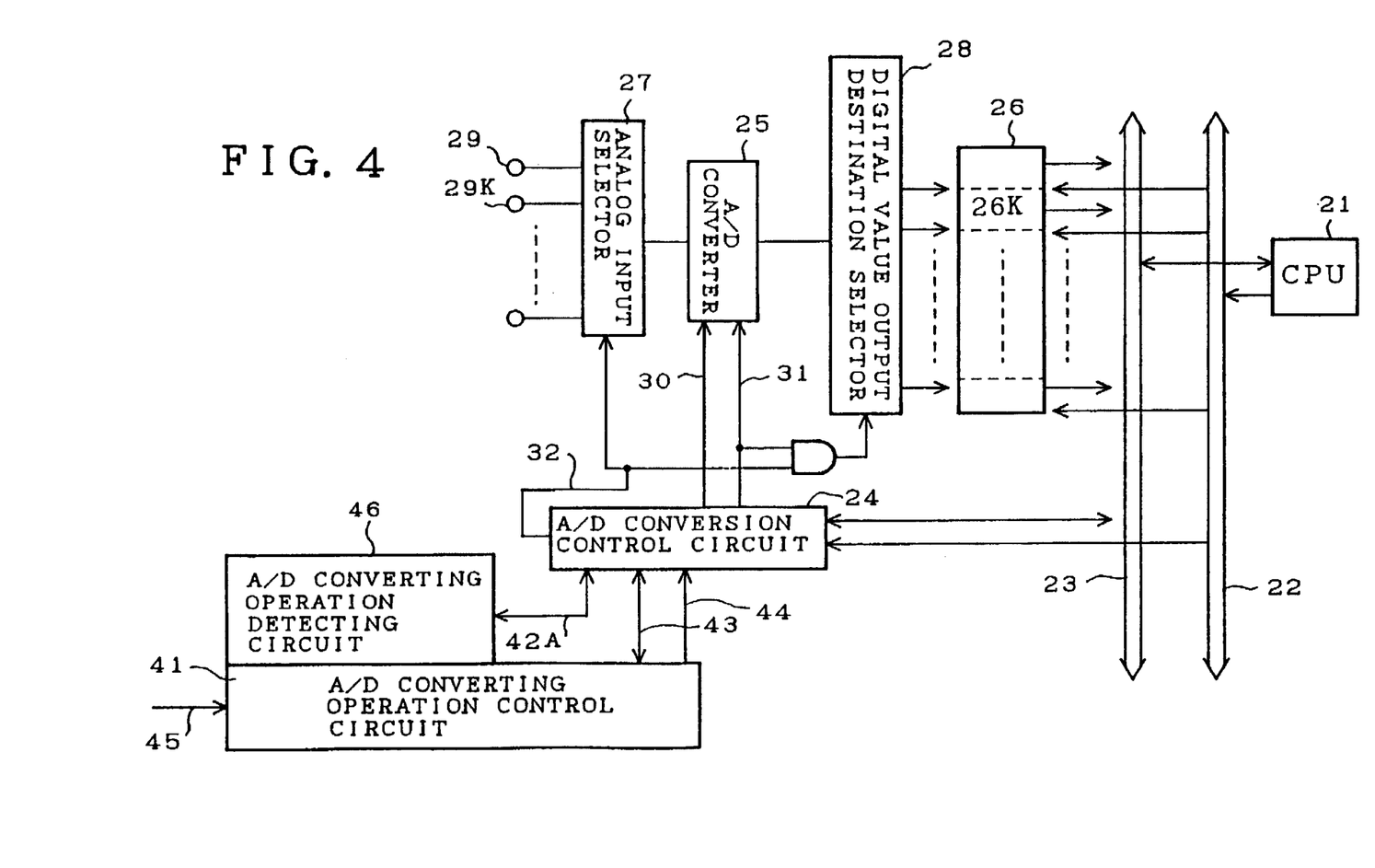
FIG. 4 is a block diagram showing the structure of an analog-to-digital converting device according to another embodiment of the present invention.

Referring now to FIG. 4, it illustrates a block diagram showing the structure of an analog-to-digital converting device according to another embodiment of the present invention. In the figure, like elements are designated by the same reference numerals as in FIG. 3 and duplicate description of the elements will be omitted hereinafter. Furthermore, in the figure reference numeral 46 denotes an analog-to-digital converting operation detecting circuit for detecting whether or not the analog-to-digital converter 25 is in action, and 42A denotes a stop signal, which is generated by the analog-to-digital converting operation detecting circuit 46, for providing instructions for stopping analog-to-digital converting operations.

Next, the description will be directed to the operation of the analog-to-digital converting device of this exemplary embodiment. The descriptions of imposing operating conditions on the analog-to-digital conversion control circuit 24 and analog-to-digital converting operation control circuit 41, and the start of analog-to-digital converting operations are similar to those in the first embodiment, and therefore the duplicate description of about these operations will be omitted hereinafter.

During a scanning operation of the analog-to-digital converter 25, if the TRG signal 45 is applied to the analog-to-digital converting operation control circuit 41 and then the analog-to-digital converting operation detecting circuit 46 detects an active analog-to-digital converting operation of the analog-to-digital converter 25 for an arbitrary input channel, the analog-to-digital converting operation control circuit 41 does not stop the analog-to-digital converter 25 which is in action at once. It waits for the analog-to-digital converter 25 to finish the on-the-fly analog-to-digital converting operation for the input channel and then delivers the stop signal 42A to the analog-to-digital conversion control circuit 24. The analog-to-digital conversion control circuit 24 sends out the stop signal 31 to the analog-to-digital converter 25 in response to the stop signal 42A so as to stop the scanning operation of the converter.

Following the termination of the scanning operation, the analog-to-digital converting operation control circuit 41 rewrites the operating conditions which were set up at the time of starting the analog-to-digital converting operations into the analog-to-digital conversion control circuit 24 by means of the operation conditions setting signal 43. After the operating conditions are rewritten into the circuit 24, the analog-to-digital converting operation control circuit 41 makes the start signal 44 which triggers analog-to-digital converting operation and delivers it to the analog-to-digital converting control circuit 24. The analog-to-digital conversion control circuit 24 sends out the start signal 30 to the analog-to-digital converter 25 in response to the start signal 44 so as to restart the converter.

Thus, according to this embodiment, only applying the TRG signal 45 makes it possible to automatically restart an analog-to-digital converting operation under the operating conditions initially set up from the input channel initially selected without recourse to the CPU 21. Additionally, since the analog-to-digital converter is not stopped until an on fly analog-to-digital converting operation is completed, the uncertainty of the digital value obtained by the analog-to-digital converting operation can be avoided.

Figure 5:
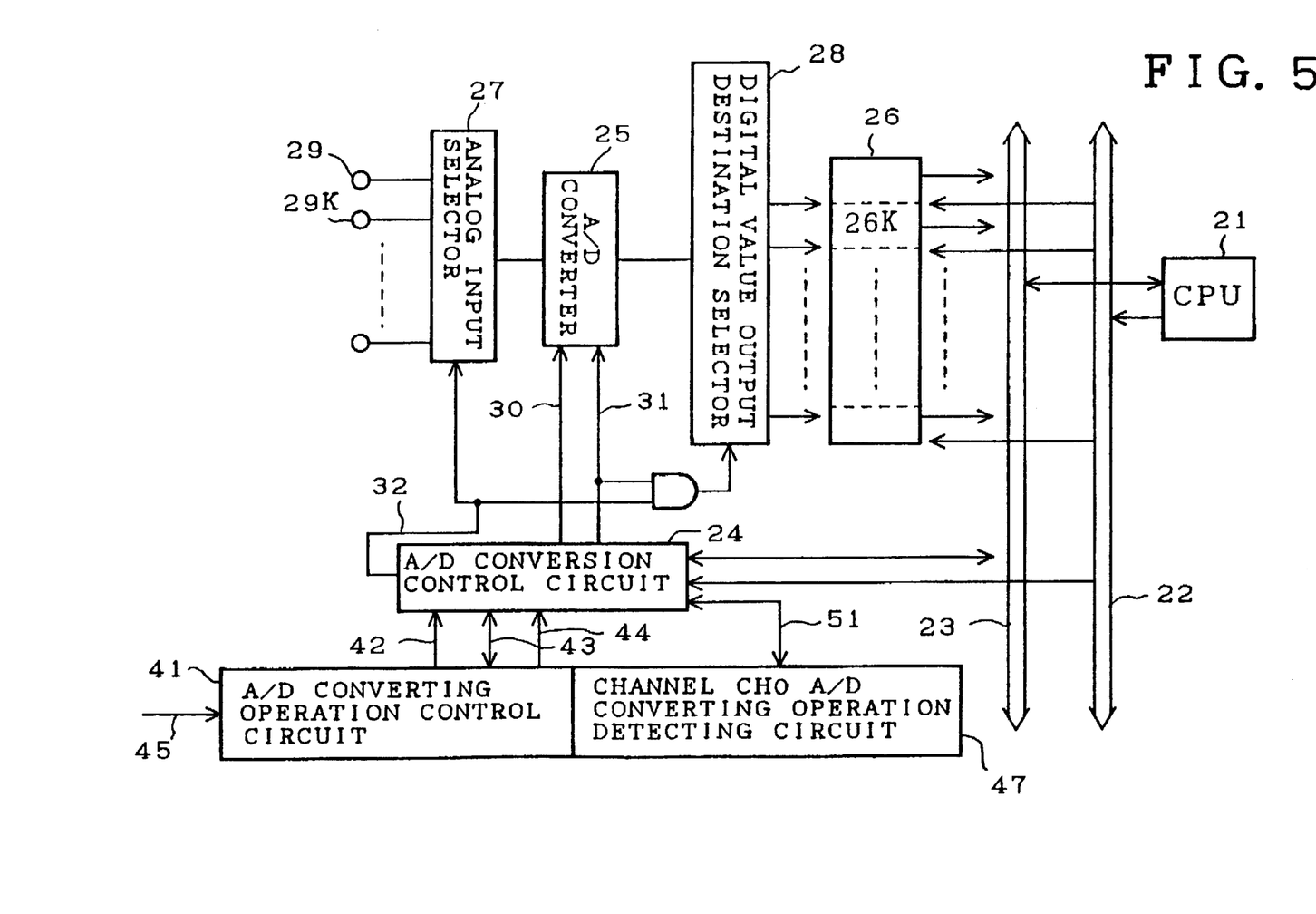
FIG. 5 is a block diagram showing the structure of an analog-to-digital converting device according to another embodiment of the present invention.

Referring now to FIG. 5, it illustrates a block diagram showing the structure of an analog-to-digital converting device according to another exemplary embodiment of the present invention. In the figure, like elements are designated by the same reference numerals as in FIG. 3 and the duplicate description of about the elements will be omitted hereinafter. Furthermore, in the figure reference numeral 47 denotes a channel ch0 analog-to-digital converting operation detecting circuit which detects whether or not the analog-to-digital converter 25 converts an analog signal present at the input channel ch0 into a digital signal, and reference numeral 51 denotes a detection signal showing that the analog-to-digital converter 25 converts an analog signal present at the input channel ch0 into a digital signal.

Next, the description will be directed to the operation of the analog-to-digital converting device of this exemplary embodiment. The descriptions of imposing operating conditions on the analog-to-digital conversion control circuit 24 and analog-to-digital converting operation control circuit 41 and the start of analog-to-digital converting operations are similar to those in the first exemplary embodiment, and therefore the duplicate description of about these operations will be omitted hereinafter.

During a scanning operation of the analog-to-digital converter 25, if the TRG signal 45 is applied to the analog-to-digital converting operation control circuit 41, the channel ch0 analog-to-digital converting operation detecting circuit 47 determines whether or not it detects an active analog-to-digital converting operation of the analog-to-digital converter 25 for the input channel ch0 by using the detection signal 51. When the channel ch0 analog-to-digital converting operation detecting circuit 47 determines that the analog-to-digital converter 25 is converting an analog signal present at the input channel ch0 into a digital signal, the analog-to-digital converting operation control circuit 41 gives no instructions to the analog-to-digital conversion control circuit 24 regardless of the TRG signal 45. On the other hand, when the channel ch0 analog-to-digital converting operation detecting circuit 47 determines that the analog-to-digital converter 25 is converting an analog signal present at another input channel except the input channel ch0 into a digital signal, the analog-to-digital converting operation control circuit 41 makes the stop signal 42 active at once and delivers it to the analog-to-digital conversion control circuit 24. The analog-to-digital conversion control circuit 24 sends out the stop signal 31 to the analog-to-digital converter 25 in response to the stop signal 42 so as to forcefully stop the scanning operation of the converter. Following the termination of the scanning operation, the analog-to-digital converting operation control circuit 41 rewrites the operating conditions which were set up at the time of starting the analog-to-digital converting operations into the analog-to-digital conversion control circuit 24 by means of the operation conditions setting signal 43. After imposing the operating conditions on the circuit 24, the analog-to-digital converting operation control circuit 41 makes the start signal 44 which triggers analog-to-digital converting operation active and delivers it to the analog-to-digital converting control circuit 24. The analog-to-digital conversion control circuit 24 sends out the start signal 30 to the analog-to-digital converter 25 in response to the start signal 44 so as to restart the converter.

Thus, according to this exemplary embodiment, only applying the TRG signal 45 makes it possible to automatically restart an analog-to-digital converting operation under the operating conditions initially set up from the input channel initially selected without recourse to the CPU 21. Additionally, since the analog-to-digital converter can not be stopped forcefully while it is analog-to-digital converting an analog signal present at the predetermined input channel ch0, the analog-to-digital converting device makes it possible to avoid needless operations of restarting a scanning from the input channel ch0 after forcefully stopping an analog-to-digital converting operation for the input channel ch0 in the case of scanning the input channels ch0–ch4 as mentioned above.

In this exemplary embodiment, there is provided a means for preventing the analog-to-digital converting device from forcefully stopping an analog-to-digital converting operation for the input channel ch0, as an example. Alternatively, the analog-to-digital converting device may include a converting operation detecting circuit for detecting whether or not the analog-to-digital converter is converting an analog signal present at another input channel, not the input channel ch0, into a digital signal in order not to forcefully stop the converter during the analog-to-digital conversion for the other input channel.

Figure 6:
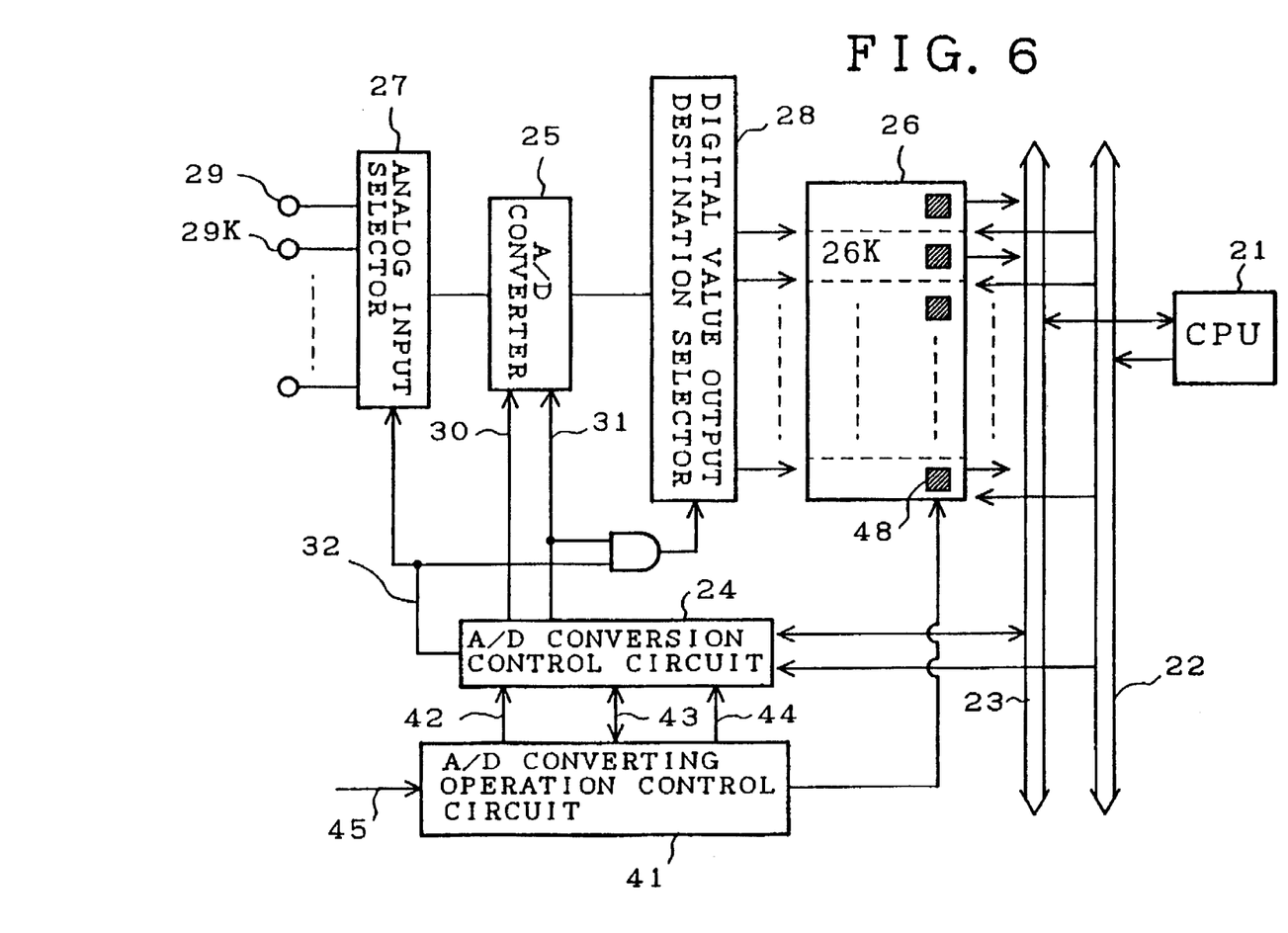
FIG. 6 is a block diagram showing the structure of an analog-to-digital converting device according to another embodiment of the present invention.

Referring now to FIG. 6, it illustrates a block diagram showing the structure of an analog-to-digital converting device according to another exemplary embodiment of the present invention. In the figure, like elements are designated by the same reference numerals as in FIG. 3 and the duplicate description of about the elements will be omitted hereinafter. Furthermore, in the figure reference numeral 48 denotes a semaphore, one of which is provided for each input channel through which an analog signal is input and then converted into a digital signal, for determining whether or not a converted result stored in each of the digital value storing registers 26 has been read out.

Next, the description will be directed to the operation of the analog-to-digital converting device of this exemplary embodiment. The descriptions of imposing operating conditions on the analog-to-digital conversion control circuit 24 and analog-to-digital converting operation control circuit 41 and the start of analog-to-digital converting operations are similar to those in the first exemplary embodiment, and therefore the duplicate description of about these operations will be omitted hereinafter.

A bit of each of the digital value storing registers 26 is used as each of the semaphores 48 for determining whether or not a converted result in each register has been read out. The contents of all the semaphores 48 are cleared when the TRG signal 45 is applied to the analog-to-digital converting device. Furthermore, the contents of each of the semaphores 48 are cleared when an digital value, which is obtained by the analog-to-digital converter 25, is written into a corresponding register. That is, the analog-to-digital converting operation control circuit 41 clears the contents of all of the semaphores 48 each for determining whether or not a converted result in each register has been read out in response to the TRG signal 45. In addition, after the analog-to-digital converter 25 has finished performing an analog-to-digital converting operation on an input channel, the result obtained from an analog signal present at the input channel is stored in a corresponding one of the digital value storing registers 26 while the semaphore 48 which corresponds to the input channel is cleared. When the CPU 21 reads out data stored in one of the digital value storing registers 26, the corresponding one of the semaphores 48 included in the register is set to logic one.

Thus, after the CPU 21 has read out data stored in an arbitrary one of the digital value storing registers 26 and then the corresponding one of the semaphores 48 has been set to logic one, the contents of the semaphore 48 must be changed if the TRG signal 45 is applied to the device or a converted result is written into the register by the analog-to-digital converter 25. Therefore, it becomes possible to determine whether or not a digital value stored in each of the digital value storing registers 26 is the latest one by checking the binary data stored in each of the semaphores 48 for determining whether or not a converted result in each register has been read out.

Figure 7:
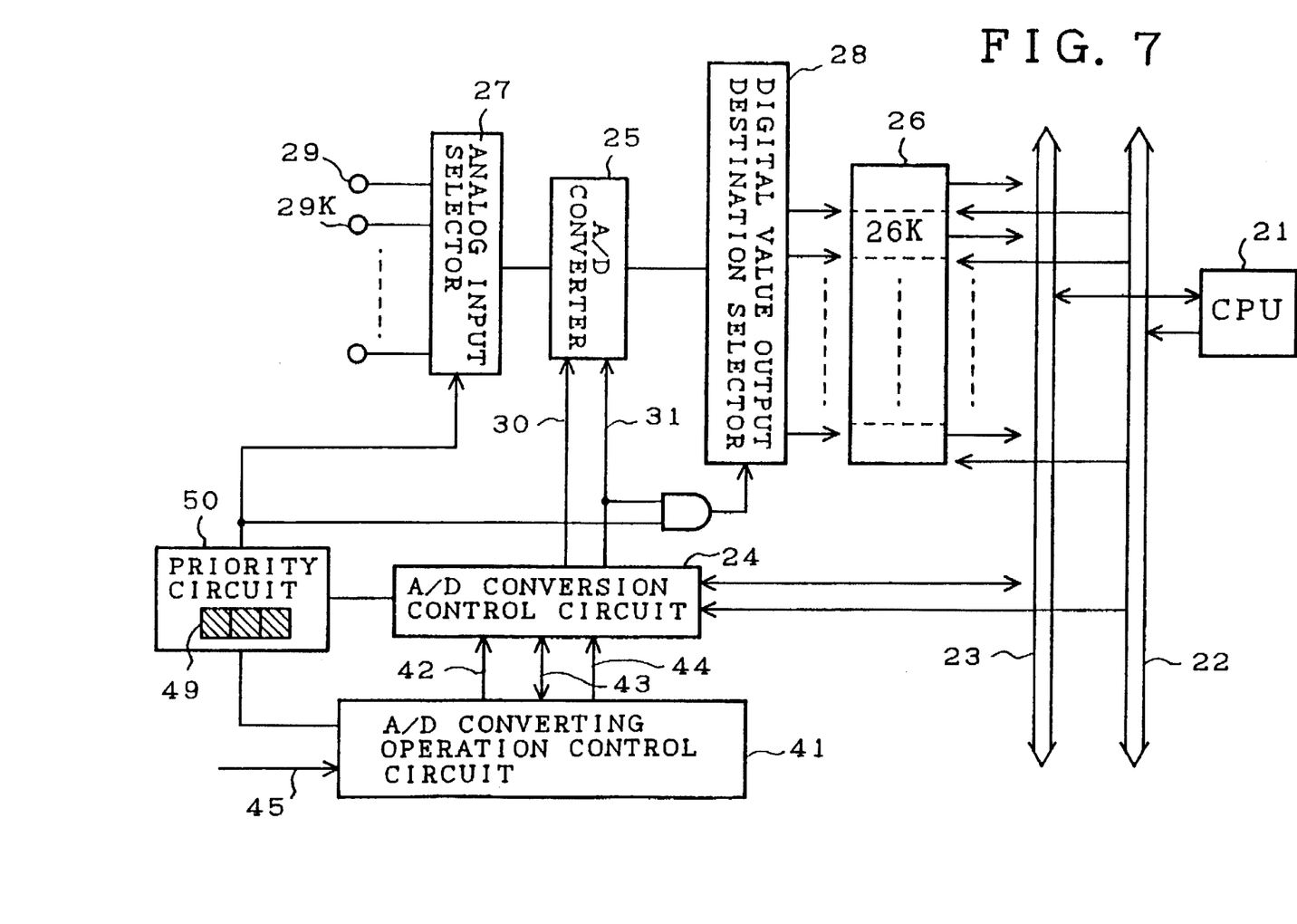
FIG. 7 is a block diagram showing the structure of an analog-to-digital converting device according to another embodiment of the present invention.

Referring now to FIG. 7, a block diagram showing the structure of an analog-to-digital converting device according to another exemplary embodiment of the present invention. In the figure, like elements are designated by the same reference numerals as in FIG. 3 and the duplicate description of the elements will be omitted hereinafter. Furthermore, in the figure, reference numeral 49 denotes a priority register for determining an input channel from which an analog-to-digital converting operation will be performed first after the analog-to-digital converter 25 is restarted under the operating control of the analog-to-digital converting operation control circuit 41, and reference numeral 50 denotes a priority circuit for controlling the analog input selector 27 so as to restart the analog-to-digital converter 25 to convert an analog signal present at the input channel determined by the priority register 49 into a digital signal at the start of scanning in response to instructions given by the analog-to-digital conversion control circuit 24.

Next, the description will be directed to the operation of this exemplary embodiment. A software program allows the CPU 21 to write operating conditions which define the analog-to-digital converting operation, e.g., operation conditions under which analog-to-digital converting operations are performed repeatedly for the input channels ch0–ch7, in a scan mode, into the analog-to-digital conversion control circuit 24. In this case, the operating conditions are written into the analog-to-digital converting operation control circuit 41 using the operating conditions setting signal 43 while they are written into the analog-to-digital conversion control circuit 24. Then, the CPU 21 writes a value showing the start of analog-to-digital converting operations into an analog-to-digital converting start register included in the analog-to-digital conversion control circuit 24 and makes the analog-to-digital converter 25 start to perform analog-to-digital converting operations for the input channels ch0–ch7 in the scan mode.

Figure 8:
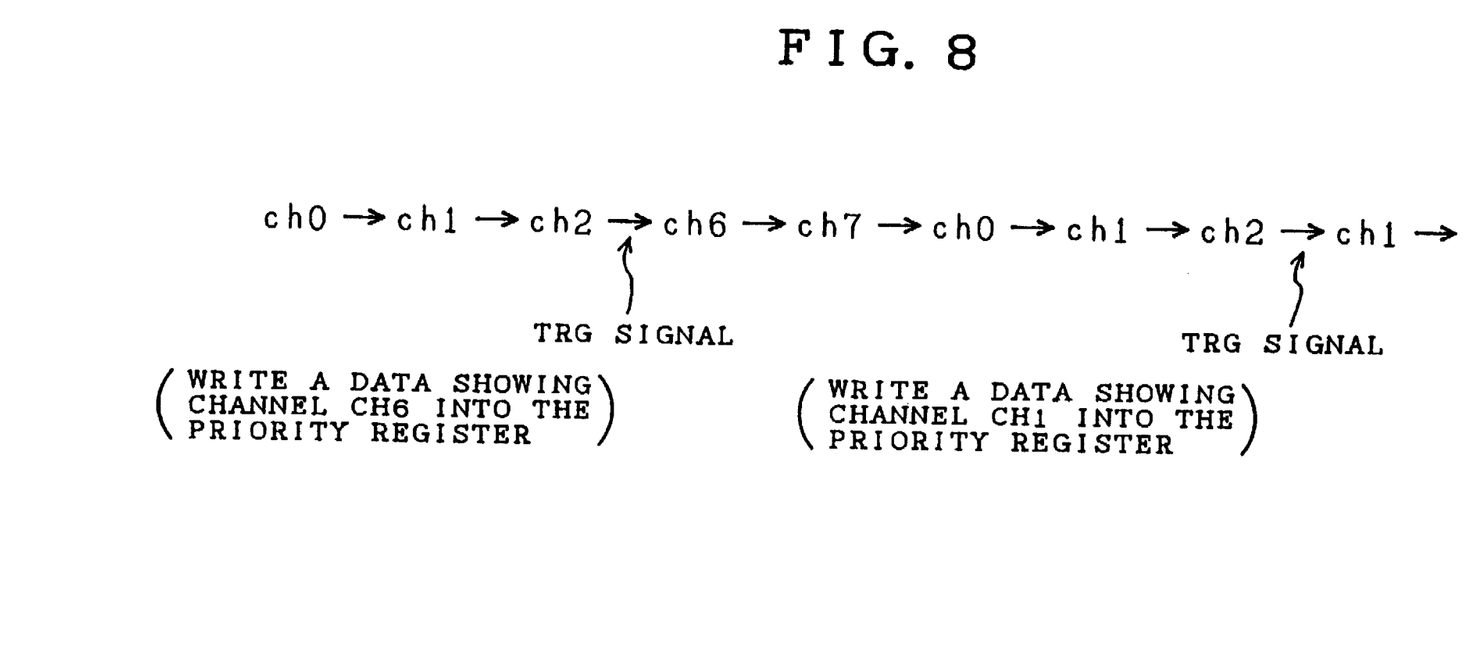
FIG. 8 is a diagram showing an operation of the analog-to-digital converting device shown in FIG. 7.

During the scanning control of the analog-to-digital conversion control circuit 24, the software program allows the CPU 21 to set a bit, which corresponds to a desired input channel, to be handled first after the restart of the converter, included in the priority register 49 of the priority circuit 50 to logic one. For example, a bit of the priority register 49 which corresponds to the input channel ch5 is set to logic one. After that, when the TRG signal 45 is applied to the device during the scanning operation, the analog-to-digital converting operation control circuit 41 makes the stop signal 42 active immediately to allow the analog-to-digital converting circuit 24 to forcefully stop the scanning operation. Furthermore, the analog-to-digital converting operation control circuit 41 imposes the operating conditions and then makes the analog-to-digital converting operation start signal 44 active to restart the analog-to-digital converter 25 from the input channel determined by the priority register 49 disposed in the priority circuit 50. FIG. 8 shows an example of changes of input channels in scanning operations according to this exemplary embodiment. As shown in FIG. 8, binary data describing the input channel ch6 is firstly written into the priority register 49 during the first scanning operation. After the TRG signal 45 has been applied to the device, the second scanning operation is performed, starting from the input channel ch6. Then, binary data describing the input channel ch1 is written into the priority register 49 during the second scanning operation. After the TRG signal 45 has been applied to the device, the third scanning operation is perform, starting from the input channel ch1.

Thus, according to this exemplary embodiment, only applying the TRG signal 45 makes it possible to automatically restart an analog-to-digital converting operation under the operating conditions initially set up from the input channel initially selected without recourse to the CPU 21. Additionally, since rewriting new contents into the priority register 49 and then applying the TRG signal 45 makes it possible to restart a scanning operation from an arbitrary input channel, the size of the software program can be reduced and hence the load on the CPU 21 can be decreased.

As previously mentioned, the present invention offers the following advantageous effects.

In accordance with the present invention, there is provided an analog-to-digital converting device comprising a control unit for temporarily stopping an analog-to-digital converter in response to a predetermined signal applied thereto and then restarting the analog-to-digital converter by imposing operating conditions stored in an operating conditions storing unit on the analog-to-digital converter again. Therefore, only applying the predetermined signal makes it possible to automatically restart an analog-to-digital converting operation under the operating conditions stored in the operating conditions storing unit from the input channel initially selected without recourse to the CPU. This results in decreasing the load on the CPU.

In a preferred embodiment of the present invention, the control unit further comprises a stopping unit for forcefully stopping the analog-to-digital converter in response to the predetermined signal even if the analog-to-digital converter is in action. Similarly, only applying the predetermined signal makes it possible to automatically restart an analog-to-digital converting operation under the operating conditions stored in the operating conditions storing unit from the input channel initially selected without recourse to the CPU. This results in decreasing the load on the CPU.

According to a preferred embodiment of the present invention, the analog-to-digital converting device further comprises an analog-to-digital converting operation detecting unit for detecting whether or not the analog-to-digital converter is in action. Furthermore, when the analog-to-digital converting operation detecting unit determines that the analog-to-digital converter is in action after the control unit receives the predetermined signal, the control unit stops the analog-to-digital converter after the on-the-fly analog-to-digital converting operation is completed. Therefore, the analog-to-digital converting device makes it possible to avoid the uncertainty of the digital value obtained by the analog-to-digital converting operation in addition to decreasing the load on the CPU.

In a preferred embodiment of the present invention, the analog-to-digital converting device further comprises an analog-to-digital converting operation detecting unit for detecting whether or not the analog-to-digital converter is converting an analog signal present at a predetermined input channel into a digital signal. Furthermore, when the analog-to-digital converting operation detecting unit detects an analog-to-digital converting operation on the predetermined input channel after the control unit has received the predetermined signal, the control unit cancels the stopping operation on the analog-to-digital converter to proceed with analog-to-digital converting operations. Therefore, the analog-to-digital converting device makes it possible to avoid needless operations of restarting a scanning from the specific input channel after forcefully stopping an analog-to-digital converting operation for the input channel in addition to decreasing the load on the CPU.

According to a preferred embodiment of the present invention, the analog-to-digital converting device further comprises a plurality of registers each storing a digital value obtained by the analog-to-digital converter, and a plurality of semaphores having a one-to-one correspondence with the plural registers. The contents of all the semaphores are cleared in response to the predetermined signal. Furthermore, the contents of each semaphore are cleared when a digital value is written into a corresponding register. Each semaphore is set to a specific value when the contents of a corresponding register is read out. Therefore, the analog-to-digital converting device makes it possible to determine whether or not a digital value stored in each of the digital value storing registers is the latest one by checking the binary data of each of the semaphores in addition to decreasing the load on the CPU.

In a preferred embodiment of the present invention, the analog-to-digital converting device further comprises a priority unit for determining an input channel from which an analog-to-digital converting operation is to be performed first when the analog-to-digital converter is restarted after the control unit has received the predetermined signal, and a unit for restarting the analog-to-digital converter after the control unit has received the predetermined signal so that the analog-to-digital converter converts an analog signal present at the input channel determined by the priority unit into a digital signal first. Therefore, only applying the predetermined signal makes it possible to automatically restart a scanning operation from an arbitrary input channel. This results in decreasing the load on the CPU.

Many widely different embodiments of the present invention may be constructed without departing from the spirit and scope of the present invention. It should be understood that the present invention is not limited to the specific embodiments described in the specification, except as defined in the appended claims.

What is claimed is:

1. An analog-to-digital converting device comprising:
   operating conditions storing means for storing operating conditions defining analog-to-digital converting operations of an analog-to-digital converter; and
   control means for temporarily stopping the analog-to-digital converter in response to a trigger signal and for restarting the analog-to-digital converter utilizing the operating conditions stored in said operating conditions storing means.

2. The analog-to-digital converting device according to claim 1, comprising a plurality of registers, each register storing a digital value produced by the analog-to-digital converter, and a plurality of semaphores having a one-to-one correspondence with said plurality of registers, all of the semaphores being cleared in response to the trigger signal, and a respective semaphore being cleared when a digital value is written into the corresponding register, each semaphore being set to a specific value when the corresponding register is read out.

3. The analog-to-digital converting device according to claim 1, comprising priority means for specifying an input channel for supplying an analog signal for an initial analog-to-digital converting operation when the analog-to-digital converter is restarted after said control means has received the trigger signal, and means for restarting the analog-to-digital converter after said control means has received the trigger signal so that the analog-to-digital converter first converts the analog signal present at the input channel specified by said priority means into a digital signal.

4. The analog-to-digital converting device according to claim 2, comprising priority means for specifying an input channel for supplying an analog signal for an initial analog-to-digital converting operation when the analog-to-digital converter is restarted after said control means has received the trigger signal, and means for restarting the analog-to-digital converter after said control means has received the trigger signal so that the analog-to-digital converter first converts the analog signal present at the input channel specified by said priority means into a digital signal.

5. The analog-to-digital converting device according to claim 1, wherein said control means comprises stopping means for forcefully stopping the analog-to-digital converter in response to the trigger signal even if the analog-to-digital converter is operating.

6. The analog-to-digital converting device according to claim 5, comprising a plurality of registers, each register storing a digital value produced by the analog-to-digital converter, and a plurality of semaphores having a one-to-one correspondence with said plurality of registers, all of the semaphores being cleared in response to the trigger signal, and a respective semaphore being cleared when a digital value is written into the corresponding register, each semaphore being set to a specific value when the corresponding register is read out.

7. The analog-to-digital converting device according to claim 5, comprising priority means for specifying an input channel for supplying an analog signal for an initial analog-to-digital converting operation when the analog-to-digital converter is restarted after said control means has received the trigger signal, and means for restarting the analog-to-digital converter after said control means has received the trigger signal so that the analog-to-digital converter first converts the analog signal present at the input channel specified by said priority means into a digital signal.

8. The analog-to-digital converting device according to claim 6, comprising priority means for specifying an input channel for supplying an analog signal for an initial analog-to-digital converting operation when the analog-to-digital converter is restarted after said control means has received the trigger signal, and means for restarting the analog-to-digital converter after said control means has received the trigger signal so that the analog-to-digital converter first converts the analog signal present at the input channel specified by said priority means into a digital signal.

9. The analog-to-digital converting device according to claim 1, comprising analog-to-digital converting operation detecting means for detecting whether the analog-to-digital converter is operating, and, when the analog-to-digital converter is operating, after said control means receives the trigger signal, said control means stops the analog-to-digital converter after an on-going analog-to-digital converting operation has been completed.

10. The analog-to-digital converting device according to claim 9, comprising a plurality of registers, each register storing a digital value produced by the analog-to-digital converter, and a plurality of semaphores having a one-to-one correspondence with said plurality of registers, all of the semaphores being cleared in response to the trigger signal, and a respective semaphore being cleared when a digital value is written into the corresponding register, each semaphore being set to a specific value when the corresponding register is read out.

11. The analog-to-digital converting device according to claim 9, comprising priority means for specifying an input channel for supplying an analog signal for an initial analog-to-digital converting operation when the analog-to-digital converter is restarted after said control means has received the trigger signal, and means for restarting the analog-to-digital converter after said control means has received the trigger signal so that the analog-to-digital converter first converts the analog signal present at the input channel specified by said priority means into a digital signal.

12. The analog-to-digital converting device according to claim 10, comprising priority means for specifying an input channel for supplying an analog signal for an initial analog-to-digital converting operation when the analog-to-digital converter is restarted after said control means has received the trigger signal, and means for restarting the analog-to-digital converter after said control means has received the trigger signal so that the analog-to-digital converter first converts the analog signal present at the input channel specified by said priority means into a digital signal.

13. The analog-to-digital converting device according to claim 1, comprising analog-to-digital converting operation detecting means detecting whether the analog-to-digital converter is converting an analog signal from a specified input channel into a digital signal, and, when an analog-to-digital converting operation of the analog signal from the predetermined input channel is detected after said control receives the trigger signal, said control means cancels stopping of the analog-to-digital converter.

14. The analog-to-digital converting device according to claim 13, comprising a plurality of registers, each register storing a digital value produced by the analog-to-digital converter, and a plurality of semaphores having a one-to-one correspondence with said plurality of registers, all of the semaphores being cleared in response to the trigger signal, and a respective semaphore being cleared when a digital value is written into the corresponding register, each semaphore being set to a specific value when the corresponding register is read out.

15. The analog-to-digital converting device according to claim 13, comprising priority means for specifying an input channel for supplying an analog signal for an initial analog-to-digital converting operation when the analog-to-digital converter is restarted after said control means has received the trigger signal, and means for restarting the analog-to-digital converter after said control means has received the trigger signal so that the analog-to-digital converter first converts the analog signal present at the input channel specified by said priority means into a digital signal.

16. The analog-to-digital converting device according to claim 14, comprising priority means for specifying an input channel for supplying an analog signal for an initial analog-to-digital converting operation when the analog-to-digital converter is restarted after said control means has received the trigger signal, and means for restarting the analog-to-digital converter after said control means has received the trigger signal so that the analog-to-digital converter first converts the analog signal present at the input channel specified by said priority means into a digital signal.

* * * * *